(12) United States Patent
Nakano et al.

(10) Patent No.: US 10,361,325 B2
(45) Date of Patent: Jul. 23, 2019

(54) SOLAR CELL MODULE AND METHOD FOR MANUFACTURING SAME

(71) Applicant: KANEKA CORPORATION, Osaka-shi, Osaka (JP)

(72) Inventors: Kunihiro Nakano, Settsu (JP); Kunta Yoshikawa, Settsu (JP); Toru Terashita, Settsu (JP); Masafumi Hiraishi, Settsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 109 days.

(21) Appl. No.: 15/128,360

(22) PCT Filed: Mar. 26, 2015

(86) PCT No.: PCT/JP2015/059516
§ 371 (c)(1),
(2) Date: Sep. 22, 2016

(87) PCT Pub. No.: WO2015/152020
PCT Pub. Date: Oct. 8, 2015

(65) Prior Publication Data
US 2017/0125619 A1 May 4, 2017

(30) Foreign Application Priority Data
Mar. 31, 2014 (JP) .................. 2014-074692

(51) Int. Cl.
*H02N 6/00* (2006.01)
*H01L 31/042* (2014.01)
(Continued)

(52) U.S. Cl.
CPC ........ *H01L 31/043* (2014.12); *H01L 31/0201* (2013.01); *H01L 31/02167* (2013.01);
(Continued)

(58) Field of Classification Search
CPC ....................................................... H01L 31/043
See application file for complete search history.

(56) References Cited

U.S. PATENT DOCUMENTS

2006/0260673 A1* 11/2006 Takeyama ......... H01L 31/02242
136/252
2011/0308570 A1* 12/2011 Luch ................. H01L 31/02008
136/244

(Continued)

FOREIGN PATENT DOCUMENTS

| JP | S51122574 U | 10/1976 |
| JP | S593980 A | 1/1984 |

(Continued)

OTHER PUBLICATIONS

International Bureau of WIPO, International Preliminary Report on Patentability Issued in Application No. PCT/JP2015/059516, Oct. 13, 2016, WIPO, 7 pages.

(Continued)

*Primary Examiner* — Angelo Trivisonno
(74) *Attorney, Agent, or Firm* — Alleman Hall Creasman & Tuttle LLP

(57) ABSTRACT

In the solar cell module, a first solar cell and a second solar cell are stacked together with an electroconductive member interposed therebetween, such that a cleaved surface-side periphery on a light-receiving surface of the first solar cell overlaps a periphery on a back surface of the second solar cell. The first solar cell and the second solar cell each have: photoelectric conversion section including a crystalline silicon substrate; collecting electrode; and back electrode. At a section where the first solar cell and the second solar cell are stacked, the collecting electrode of the first solar cell and the back electrode of the second solar cell are electrically connected to each other by coming into contact with the electroconductive member. An insulating member is pro- (Continued)

vided on a part of the cleaved surface-side periphery on the light-receiving surface of the first solar cell, where the collecting electrode is not provided.

15 Claims, 9 Drawing Sheets

(51) Int. Cl.
    *H01L 31/043* (2014.01)
    *H01L 31/0224* (2006.01)
    *H01L 31/05* (2014.01)
    *H01L 31/02* (2006.01)
    *H01L 31/0216* (2014.01)
    *H01L 31/0352* (2006.01)
    *H01L 31/077* (2012.01)
    *H01L 31/20* (2006.01)
(52) U.S. Cl.
    CPC ........... *H01L 31/022433* (2013.01); *H01L 31/022466* (2013.01); *H01L 31/035281* (2013.01); *H01L 31/0504* (2013.01); *H01L 31/077* (2013.01); *H01L 31/20* (2013.01); *Y02E 10/50* (2013.01)

(56) References Cited

U.S. PATENT DOCUMENTS

| 2013/0152996 A1* | 6/2013 | DeGroot | H01L 31/0508 136/244 |
| 2013/0263912 A1 | 10/2013 | Iwade et al. | |
| 2015/0075601 A1 | 3/2015 | Adachi et al. | |

FOREIGN PATENT DOCUMENTS

| JP | H06140651 A | 5/1994 |
| JP | 2005123445 A | 5/2005 |
| JP | 2009130193 A | 6/2009 |
| JP | 2012134342 A | 7/2012 |
| JP | 2012195461 A | 10/2012 |
| JP | 2013171903 A | 9/2013 |
| JP | 5425349 B1 | 2/2014 |

OTHER PUBLICATIONS

ISA Japan Patent Office, International Search Report Issued in Application No. PCT/JP2015/059516, May 26, 2015, WIPO, 4 pages.

* cited by examiner (a)

(b)

(c)

< Conventional Art >

SOLAR CELL MODULE AND METHOD FOR MANUFACTURING SAME

TECHNICAL FIELD

The invention relates to solar cell module and method for manufacturing thereof.

BACKGROUND ART

Since energy issues and global environmental issues are becoming more serious, solar cells are receiving more attention as an alternative energy source for replacing fossil fuels. In the solar cell, carriers (electrons and holes) generated by photo irradiation to a photoelectric conversion section composed of a semiconductor junction or the like are extracted to an external circuit to generate electricity. Solar cell having a collecting electrode on the photoelectric conversion section is utilized for efficiently extracting carriers generated at the photoelectric conversion section to the external circuit.

Solar cells are classified broadly into thin-film-based solar cells in which a photoelectric conversion layer is deposited on a glass substrate or an electroconductive substrate, and crystalline solar cells using a single-crystalline silicon substrate or a polycrystalline silicon substrate.

Generally, a plurality of solar cells are connected in series or in parallel through a wiring member to form a module, and put into practical use. Solar cells are modularized by an appropriate method. For example, the collecting electrode of the solar cell is electrically connected to a wiring member, and adjacent solar cells are connected to each other with a gap section provided therebetween so that the solar cells are not in contact with each other. However, in a solar cell module prepared in this way, the gap section is a region which does not contribute to power generation, and therefore module power generation efficiency is insufficient.

Patent Documents 1 to 3 each propose a method for manufacturing a solar cell module in which a plurality of solar cells are stacked together with an electroconductive member interposed therebetween in such a manner that the peripheries of adjacent solar cells overlap each other. According to this method, the area of a region which does not contribute to power generation is reduced.

Patent Document 1 describes a method for manufacturing a solar cell module in which a plurality of solar cells each having a small area are connected to one another. The peripheries of solar cells are superimposed one another, and then cleaved.

Patent Document 2 describes a solar cell module in which a plurality of solar cells each including an electroconductive substrate are connected to one another using a specific electroconductive adhesive. In Patent Document 2, a thin-film-based solar cell is used in which an amorphous silicon thin-film etc. is deposited as a photoelectric conversion layer on a flexible electroconductive substrate such as a stainless steel substrate. Solar cells prepared by the above-mentioned method are cleaved to a predetermined size, and the peripheries of the solar cells are superimposed on each other. Patent Document 2 describes that the cut end surface of the solar cell is covered with an insulating material for preventing a front electrode layer and a back electrode layer being short-circuited.

Patent Document 3 describes a solar cell module in which solar cells each having a solar cell element formed on a metal foil are stacked in such a manner that the ends of the solar cells overlap one another. Patent Document 3 describes that the ends of solar cells are connected by a solder that is covered with an insulating member, so that stress concentration on the connection part can be relieved to prevent damage to the connection part, etc. Patent Document 3 describes that an amorphous silicon thin-film etc. is deposited on a metal foil to prepare a solar cell sheet, the solar cell sheet is cut to a predetermined size, and the ends of the solar cells are then superimposed on each other.

PRIOR ART DOCUMENTS

Patent Documents

Patent Document 1: Japanese Patent Laid-open Publication No. 59-003980
Patent Document 2: Japanese Patent Laid-open Publication No. 6-140651
Patent Document 3: Japanese Patent Laid-open Publication No. 2009-130193

SUMMARY OF THE INVENTION

Problems to be Solved by the Invention

As described in Patent Documents 1 to 3, the peripheries of solar cells are superimposed on one another with an electroconductive member interposed between the solar cells, and thus the area of a region which does not contribute to power generation can be reduced, so that the power generation of a solar cell module can be increased.

So far, studies have been conducted on a method in which thin-film-based solar cells, particularly thin-film-based solar cells including a flexible substrate are stacked to be modularized as described in Patent Document 2 and Patent Document 3. For thin-film-based solar cells, the following method is preferable from the viewpoint of manufacturing efficiency: a method in which a photoelectric conversion layer is formed on a substrate having a size that is as large as possible, the substrate is then divided cleaved to a predetermined size, and the cleaved solar cells are stacked. For thin-film solar cells, studies for improving a solar cell module manufactured by the method above have been conducted.

On the other hand, for crystalline solar cells including a crystalline silicon substrate, an attempt has not been made to prepare a solar cell module by superimposing the peripheries of solar cells on one another.

FIG. 18 is a plan view schematically showing one example of a collecting electrode to be used in a conventional crystalline silicon-based solar cell. The collecting electrode 270 shown in FIG. 18 includes a finger electrode 271 for collecting a generated current, and a bus bar electrode 272 which is substantially orthogonal to the finger electrode 271 and electrically connects solar cells. In modularization, a wiring member is disposed on the bus bar electrode 272 to electrically connect solar cells, where solar cells are connected in series or in parallel.

When solar cells each having a collecting electrode as described above are modularized, the finger electrode and the bus bar electrode provide a shading section. Particularly, the bus bar electrode has a larger width, and hence a larger shading area as compared to the finger electrode. Therefore, even in crystalline solar cells, it is effective to stack solar cells in such a manner that the peripheries of the solar cells overlap one another in order to reduce the shading area.

Thus, the inventors have made an attempt to cleave a solar cell having a crystalline silicon substrate to a predetermined size, and stack the cleaved solar cells together with an electroconductive member interposed between the solar cells. However, it has been found that a solar cell module in which solar cells are stacked by the above-mentioned method has lower conversion efficiency and reliability as compared to a conventional solar cell module in which solar cells are connected using a wiring member.

In view of the above-mentioned situation, an object of the present invention is to provide a solar cell module with high conversion efficiency and reliability that can be prepared by stacking a plurality of solar cells each including a crystalline silicon substrate cleaved to a predetermined size.

Means for Solving the Problems

The inventors have discovered that when a solar cell is cleaved to form a cleaved surface on a lateral thereof, conversion efficiency and reliability are deteriorated at the cleaved surface. The reason for deterioration of module performance may be that a textured structure generally formed on a crystalline silicon substrate, or a structure of a photoelectric conversion section (e.g., a semiconductor layer in a heterojunction solar cell) including the substrate is disordered due to cleavage of the substrate. The inventors have first considered stacking solar cells in such a manner that the cleaved surface of a lower solar cell provides a shading section so that deterioration of module characteristics in cleaved surface is suppressed.

However, it has been found that a cleaved surface is inferior in mechanical strength to a non-cleaved surface, and therefore when the cleaved surface of a lower solar cell is covered with an upper solar cell, the lower solar cell is damaged at the cleaved surface during stacking the solar cells or modularizing the solar cells, and conversion efficiency and reliability are deteriorated due to the damage. Accordingly, the inventors have considered providing an insulating member as a buffer material on the cleaved surface-side periphery of the solar cell.

The present invention relates to a solar cell module including a first solar cell, a second solar cell, an electroconductive member, and an insulating member. The first solar cell and the second solar cell each have a photoelectric conversion section that includes a crystalline silicon substrate of first conductivity-type, a collecting electrode provided on a light-receiving surface of the photoelectric conversion section, and a back electrode provided on a back surface of the photoelectric conversion section. In the first solar cell, the crystalline silicon substrate of first conductivity-type has a first principal surface on the light-receiving side, a second principal surface on the back side, and a cleaved surface extending from the first principal surface to the second principal surface. The first solar cell and the second solar cell are stacked together with an electroconductive member interposed therebetween in such a manner that the cleaved surface-side periphery on the light-receiving surface of the first solar cell overlaps the periphery on the back surface of the second solar cell. At a stacked section of the first solar cell and the second solar cell, the collecting electrode of the first solar cell and the back electrode of the second solar cell are electrically connected to each other by coming into contact with the electroconductive member. The insulating member is provided on a part of the cleaved surface-side periphery on the light-receiving surface of the photoelectric conversion section of the first solar cell, where the collecting electrode is not provided.

Preferably, the crystalline silicon substrate of first conductivity-type of the second solar cell has a first principal surface on the light-receiving side, a second principal surface on the back side, and a non-cleaved surface extending from the first principal surface to the second principal surface. In this case, the first solar cell and the second solar cell are stacked together with an electroconductive member interposed therebetween in such a manner that the cleaved surface-side periphery on the light-receiving surface of the first solar cell overlaps the non-cleaved surface-side periphery on the back surface of the second solar cell.

In one embodiment, the plane shape of each of the first solar cell and the second solar cell is a substantially oblong shape with a short side and a long side. In this embodiment, it is preferable that the first solar cell and the second solar cell are stacked together in such a manner that the long side of the first solar cell overlaps the long side of the second solar cell, and the collecting electrode of the first solar cell includes a plurality of finger electrodes extending in the short side direction.

When the plane shape of each of the first solar cell and the second solar cell is a substantially oblong shape with a short side and a long side, the collecting electrode of the first solar cell may further include one bus bar electrode extending in the long side direction. Preferably, the bus bar electrode of the first solar cell is provided on a stacked section of the first solar cell and the second solar cell.

In one embodiment, the cleaved surface has a laser trace formed by irradiating the crystalline silicon substrate of first conductivity-type with a laser beam.

The insulating member may also be provided outside the cleaved surface-side end of the photoelectric conversion section of the first solar cell.

The insulating member may also be provided on the collecting electrode of the first solar cell.

The insulating member may be in contact with the back electrode of the second solar cell.

The insulating member may also be provided on the cleaved surface-side lateral of the photoelectric conversion section of the first solar cell. In this case, the insulating member may also be provided on the back surface of the first solar cell.

In one embodiment, the photoelectric conversion section of the first solar cell and the photoelectric conversion section of the second solar cell each include a silicon-based thin-film of opposite conductivity-type on one principal surface of the crystalline silicon substrate of first conductivity-type. Preferably, the photoelectric conversion section of the first solar cell and the photoelectric conversion section of the second solar cell each include a transparent electrode layer on the silicon-based thin-film of opposite conductivity-type.

In one embodiment, the photoelectric conversion section of the first solar cell includes a transparent electrode layer-formed region where a transparent electrode layer is formed on the silicon-based thin-film of opposite conductivity-type, and a transparent electrode layer-non-formed region where a transparent electrode layer is not formed on the silicon-based thin-film of opposite conductivity-type. Preferably, the insulating member is provided on the transparent electrode layer-non-formed region.

The thickness of the insulating member is preferably 1 μm or more and 500 μm or less.

The present invention relates to a method for manufacturing the above mentioned solar cell module. The manufacturing method according to the present invention includes the steps of: providing a first solar cell and a second solar cell; forming an insulating member on a light-receiving surface of the first solar cell; and stacking the first solar cell and the second solar cell with an electroconductive member interposed therebetween. The insulating member is formed on a part of the cleaved surface-side periphery on the light-receiving surface of the first solar cell, where the collecting electrode is not provided. The first solar cell and the second solar cell are stacked in such a manner that the cleaved surface-side periphery on the light-receiving surface of the first solar cell overlaps the periphery on the back surface of the second solar cell.

In one embodiment, the first solar cell and the second solar cell are prepared by cleaving a solar cell which has a photoelectric conversion section that includes a crystalline silicon substrate of first conductivity-type, a collecting electrode provided on a light-receiving surface of the photoelectric conversion section, and a back electrode provided on a back surface of the photoelectric conversion section.

Effects of the Invention

According to the present invention, a solar cell module with a small shading area can be easily prepared by cleaving a solar cell having a crystalline silicon substrate to a predetermined size, and stacking the solar cells after cleavage. In the present invention, deterioration of module characteristics, which may be caused in the cleaved surface, can be suppressed by stacking solar cells in such a manner that the cleaved surface of a lower solar cell provides a shading section. Further, by stacking solar cells together with an insulating member provided on the cleaved surface-side periphery of the solar cell, damage to the solar cell, which is caused from the cleaved surface, can be suppressed with the insulating member acting as a buffer material. As a result, deterioration of module conversion efficiency and reliability can be suppressed.

DESCRIPTION OF EMBODIMENT

[Basic Structure of Solar Cell Module and Method for Preparation Thereof]

Figure 1:
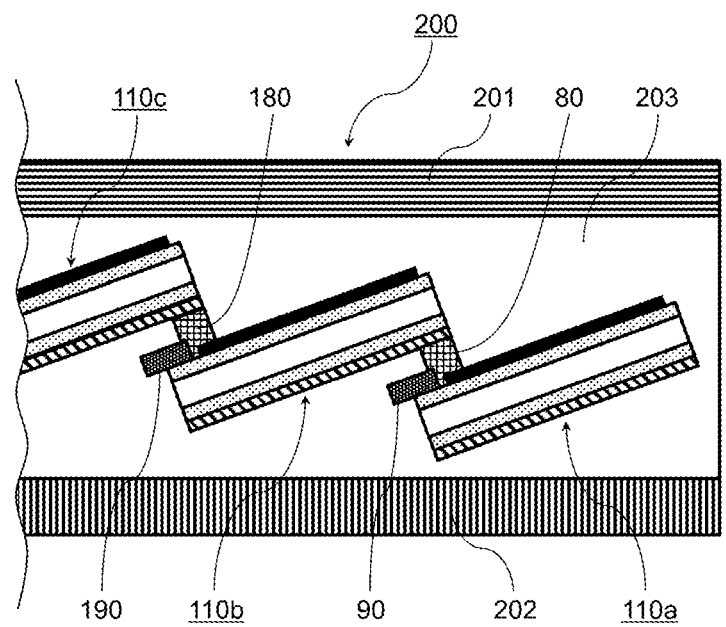
FIG. 1 is a schematic sectional view of a solar cell module according to one embodiment of the present invention.

FIG. 1 is a schematic sectional view of a solar cell module according to one embodiment of the present invention. The solar cell module 200 shown in FIG. 1 includes a first solar cell 110a, a second solar cell 110b and a third solar cell 110c. The first solar cell 110a is electrically connected to the second solar cell 110b by an electroconductive member 80, and the third solar cell 110c is electrically connected to the second solar cell 110b by another electroconductive member 180. In this way, a plurality of solar cells are connected in series or in parallel. Insulating members 90 and 190 are provided on the peripheries of the first solar cell 110a and the second solar cell 110b, respectively.

In solar cells 110a to 110c, a protective material 201 is disposed on the light-receiving side, and a protective material 202 is disposed on the back side. A sealing material 203 is provided between the protective material 201 on the light-receiving side and the protective material 202 on the back side, and solar cells 110a to 110c are sealed with the sealing material 203.

In preparation of the solar cell module, first, insulating members 90 and 190 are formed on the first solar cell 110a and the second solar cell 110b, respectively. Then, the first solar cell 110a and the second solar cell 110b are stacked together with the electroconductive member 80 interposed therebetween, and the second solar cell 110b and the third solar cell 110c are stacked together with the electroconductive member 180 interposed therebetween.

Solar cells 110a to 110c stacked in this manner are sandwiched between the protective material 201 on the light-receiving side and the protective material 202 on the back side with the sealing material 203 interposed between each solar cell and each protective material, so that the solar cell module is formed. It is preferable that as shown in FIG. 1, the sealing material 203, solar cells 110a to 110c, the sealing material 203 and the protective material 202 on the back side are sequentially stacked on the protective material 201 on the light-receiving side to obtain a laminate. Preferably, the laminate is then heated under a predetermined condition to cure the sealing material 203. Then, an aluminum frame (not illustrated) etc. is attached to prepare a solar cell module 200. For heating conditions of the laminate, the temperature of 140° C. to 160° C., the heating time of 3 minutes to 18 minutes, and the pressure of 90 kPa to 120 kPa are preferable.

Preferably, the protective material 201 on the light-receiving side is disposed on the light-receiving side of each of solar cells 110a to 110c to protect the surface of the solar cell module. As the protective material on the light-receiving side, a light-transmissive and water-permeable glass, a light-transmissive plastic, or the like can be used. Preferably, the protective material 202 on the back side is disposed on the back side of each of solar cells 110a to 110c to protect the back surface of the solar cell module. As the protective material on the back side, a resin film of polyethylene terephthalate (PET) or the like, a laminated film having a structure in which an aluminum foil is sandwiched between resin films or the like can be used.

The sealing material 203 seals solar cells 110a to 110c between the protective material 201 on the light-receiving side and the protective material 202 on the back side. As the sealing material, a light-transmissive resin such as an ethylene-vinyl acetate copolymer resin (EVA), an ethylene-ethyl acrylate copolymer resin (EEA), a polyvinyl butyral resin (PVB), a silicone resin, a urethane resin, an acrylic resin or an epoxy can be used.

As the sealing material 203, an olefin-based sealing material may also be used. An olefin-based sealing material has a lower water vapor permeability as compared to a sealing material composed of EVA or the like, and is therefore capable of suppressing ingress of water into the module. Accordingly, degradation of the insulating member etc. can be prevented, so that the reliability of the module can be improved.

As a material for the olefin-based sealing material, either a non-crosslinked olefin or a crosslinked olefin can be used. A non-crosslinked olefin is softer than a crosslinked olefin. Accordingly, when the solar cell module is bent and is used in a curved surface shape, materials for the olefin-based sealing material can be used properly. For example, when the solar cell module is bent after modularization, a non-crosslinked olefin can be suitably used. On the other hand, when the module is prepared in a bent state, a crosslinked olefin can be suitably used.

The solar cell module 200 can be prepared as described above, but the basic structure and the method for preparation of the solar cell module is not limited to those described above.

[Structure of Solar Cell]

As the solar cell, any type of crystalline silicon-based solar cell that includes a crystalline silicon substrate in the photoelectric conversion section cell can be used in the present invention. Among the crystalline silicon-based solar cells, heterojunction crystalline silicon solar cell (hereinafter, referred to as a "heterojunction solar cell" in some cases) is preferably used. The heterojunction solar cell is a crystalline silicon-based solar cell in which a silicon-based thin-film having a band gap different from that of a single-crystalline silicon is formed on a surface of a single-crystalline silicon substrate of first conductivity-type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a single-crystalline silicon substrate is known as one configuration of crystalline silicon solar cell with highest conversion efficiency.

(Photoelectric Conversion Section)

Figure 2:
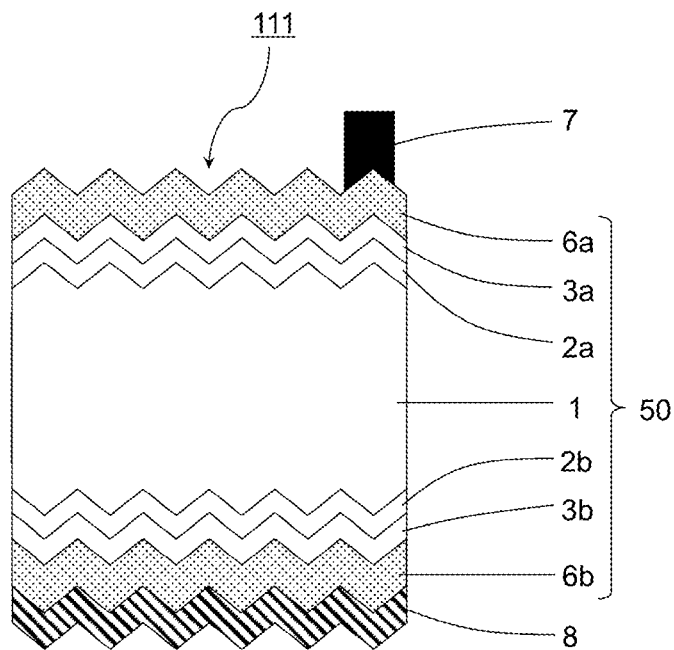
FIG. 2 is a schematic sectional view of a heterojunction solar cell module according to one embodiment.

FIG. 2 is a schematic sectional view of a heterojunction solar cell module according to one embodiment. The solar cell 111 shown in FIG. 2 includes, as a photoelectric conversion section 50, a conductive silicon-based thin-film 3a and a transparent electrode layer 6a in this order on one surface (surface on the light incident side, light-receiving surface) of the substrate 1. A conductive silicon-based thin-film 3b and a transparent electrode layer 6b are provided in this order on the other surface (surface opposite to the light incident side, back surface) of the substrate 1. A collecting electrode 7 is provided on the transparent electrode layer 6a at the surface of the photoelectric conversion section 50, and a back electrode 8 is stacked on the transparent electrode layer 6b. In the solar cell 111, it is preferable that intrinsic silicon-based thin-films 2a and 2b are respectively provided between the substrate 1 and conductive silicon-based thin-film 3a and the substrate 1 and between the conductive silicon-based thin-film 3b.

The substrate 1 is formed of a single-crystalline silicon substrate of first conductivity-type. Generally, the single-crystalline silicon substrate is classified into an n-type which contains atoms for introducing electrons into silicon atoms (e.g., phosphorus) and a p-type which contains atoms for introducing holes into silicon atoms (e.g., boron). The "first conductivity-type" means one of the n-type and the p-type. In other words, the substrate 1 is n-type or p-type. In this embodiment, it is preferable that the substrate 1 is an n-type single-crystalline silicon substrate.

Preferably, the substrate 1 has a textured structure on the light-receiving surface and the back surface. In other words, it is preferable the photoelectric conversion section 50 formed with the substrate 1 as a base also has a textured structure. In this case, the solar cell 111 can confine incident light in the photoelectric conversion section 50, so that power generation efficiency is improved.

The thickness of the substrate 1 is not particularly limited, and is preferably 50 µm or more and 200 µm or less, more preferably 100 µm or more and 150 µm or less. In the present invention, a solar cell prepared using a silicon wafer having a size of, for example, 5-inch square or 6-inch square can be cleaved to prepare a solar cell module including solar cells having a size smaller than that of the silicon wafer, and therefore even when a thin and easily deformable substrate is used, damage to solar cells can be suppressed.

As the method for forming silicon-based thin-films 2a, 3a, 2b and 3b, plasma enhanced CVD method is preferable. The conductive silicon-based thin-films 3a and 3b are silicon-based thin-film of first conductivity-type or opposite conductivity-type. The "opposite conductivity-type" is a conductivity-type different from the "first conductivity-type". For example, when the "first conductivity-type" is n-type, the "opposite conductivity-type" is p-type. In this embodiment, it is preferable that the conductive silicon-based thin-film 3a is a silicon-based thin-film of opposite conductivity-type and the conductive silicon-based thin-film 3b is a silicon-based thin-film of first conductivity-type. Examples of the silicon-based thin-film include an amorphous silicon thin-film and microcrystalline silicon thin-film (a thin-film including amorphous silicon and crystalline silicon). Among them, an amorphous silicon-based thin-film is preferably used. In this embodiment, it is preferable that the silicon-based thin-film 3a is p-type amorphous silicon-based thin-film and the silicon-based thin-film 3b is n-type amorphous silicon-based thin-film.

The intrinsic silicon-based thin-films 2a and 2b are preferably i-type hydrogenated amorphous silicon composed of silicon and hydrogen.

The photoelectric conversion section 50 of the solar cell 111 preferable includes transparent electrodes 6a and 6b on the conductive silicon-based thin-films 3a and 3b, respectively. Method for forming the transparent electrodes 6a and 6b is not particularly limited, and examples thereof include sputtering method.

The transparent electrode layers 6a and 6b preferably include conductive oxide as a main component. As the conductive oxide, for example, zinc oxide, indium oxide, and tin oxide may be used alone or in mixtures thereof. From the viewpoints of electroconductivity, optical characteristics and long-term reliability, indium-based oxides including indium oxide are preferable. Among them, those having indium tin oxide (ITO) as a main component are more suitably used. Here, the wording "as a main component" means that the content is more than 50% by weight, preferably 70% by weight or more, more preferably 85% by weight or more. The transparent electrode layer may be a single layer or a layered structure composed of multiple layers.

A dopant such as Sn, W, As, ZN, Ge, Ca, Si and C can be added to the transparent electrode layer.

The thickness of the transparent electrode layer 6a on the light-receiving side is preferably 10 nm or more and 140 nm or less, from the viewpoints of transparency, electroconductivity and reduction of light reflection. The role of the transparent electrode layer 6a is to transport carriers to the collecting electrode 7, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer 6a can also be prevented, and therefore a reduction in photoelectric conversion efficiency associated with a reduction in transmittance in an infrared range is also suppressed.

(Collecting Electrode)

The collecting electrode 7 is formed on the transparent electrode layer 6a on the light-receiving side. In a heterojunction solar cell, the transparent electrode layer can serve as a collecting electrode. Therefore, in principle, it is unnecessary to provide a collecting electrode separately. However, a conductive oxide such as ITO or zinc oxide which forms the transparent electrode layer has a higher resistivity as compared to a metal, and therefore there is the problem that the internal resistance of the solar cell increases. Accordingly, current extraction efficiency can be improved by providing a collecting electrode (metal electrode as an auxiliary electrode) on a surface of the transparent electrode layer on the light-receiving side.

When the collecting electrode on the light-receiving side has a large area, the shading loss increases, and therefore current extraction efficiency is deteriorated as described above. Accordingly, it is preferable that the collecting electrode on the light-receiving side is formed in a pattern shape such as comb-like shape.

Figure 3:
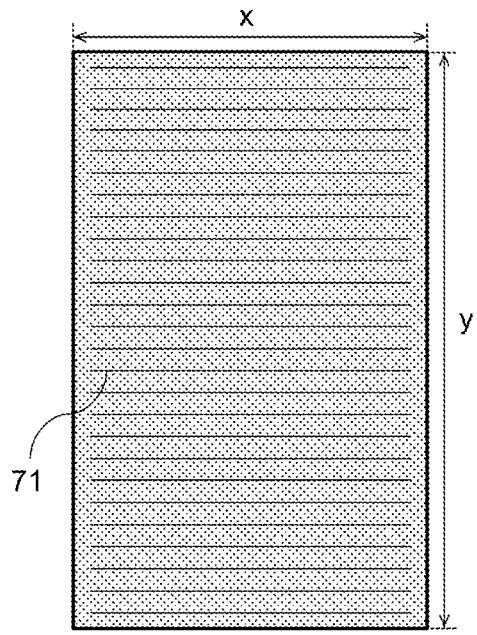
FIG. 3 is a schematic plan view on the light-receiving side of a solar cell according to one embodiment.

FIG. 3 is a schematic plan view on the light-receiving side of a solar cell according to one embodiment. In FIG. 3, the collecting electrode includes a plurality of finger electrodes 71 formed so as to extend at fixed intervals in parallel to one another.

Figure 4:
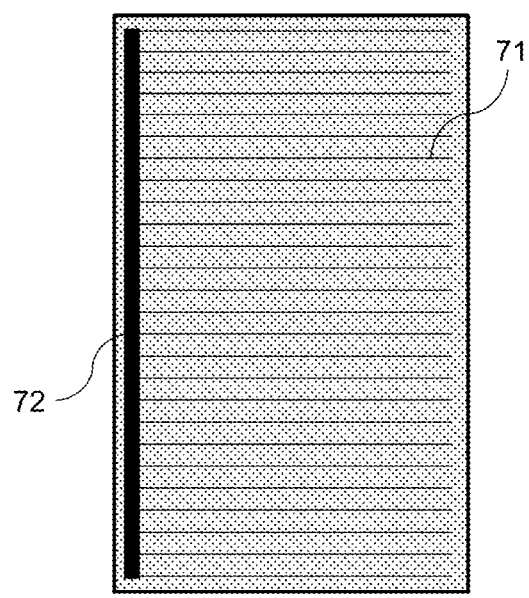
FIG. 4 is a schematic plan view on the light-receiving side of a solar cell according to another embodiment.

FIG. 4 is a schematic plan view on the light-receiving side of a solar cell according to another embodiment. As shown in FIG. 4, the collecting electrode includes a plurality of finger electrodes 71, and a bus bar electrode 72 which gathers currents collected by the finger electrodes 71. Generally, the bus bar electrode 72 is formed so as to be substantially orthogonal to the finger electrodes 71. The term "substantially orthogonal to" means that the angle formed by the finger electrode and the bus bar electrode is 85 degrees or more and 95 degrees or less. Particularly, it is preferable that the angle formed by the finger electrode and the bus bar electrode is 90 degrees, i.e., the bus bar electrode is formed so as to be orthogonal to the finger electrode.

As shown in FIG. 3 and FIG. 4, the plane shape of the solar cell is preferably a substantially rectangular shape, more preferably a substantially oblong shape with a short side and a long side. In this specification, the "substantially rectangular shape" includes not only perfectly rectangular shapes (oblong shapes including square shapes), but also shapes in which at least one corner is chipped, such as shapes in which at least one corner is rounded. Similarly, the "substantially oblong shape" includes not only perfectly oblong shapes, but also shapes in which at least one corner is chipped, such as shapes in which at least one corner is rounded.

When the plane shape of the solar cell is a substantially rectangular shape, it is preferable that the collecting electrode includes a plurality of finger electrodes extending in the direction of a pair of sides facing each other. Particularly, when the plane shape of the solar cell is a substantially oblong shape with a short side and a long side, it is preferable that the collecting electrode includes a plurality of finger electrodes extending in the short side direction. In this case, the finger electrode can be shortened, and therefore currents can be efficiently collected without providing a bus bar electrode. Where x is the length of the short side and y is the length of the long side as shown in FIG. 3, the value of x/y is preferably less than 0.8, more preferably less than 0.6. When solar cells are prepared by cleaving a substrate having a substantially rectangular shape in terms of a plane shape, the number of cleaved surfaces formed on the substrate is preferably small, and the value of x/y is preferably 0.5 or more, but the value of x/y may be less than 0.5. For example, when a photoelectric conversion section and a collecting electrode are formed after the substrate is cleaved, damage to the photoelectric conversion section due to cleavage does not occur, and therefore deterioration of module characteristics can be suppressed even when the number of cleaved surfaces is large. When the value of x/y is less than 0.5 (preferably less than 0.3), current collection efficiency can be further improved.

In the present invention, when the electroconductive member that connects solar cells can be satisfactorily electrically connected to the finger electrode, the electroconductive member can also function as a wiring member and a bus bar electrode. Therefore, it is not necessary to provide a bus bar electrode. On the other hand, in addition to the finger electrodes, the collecting electrode may include a bus bar electrode extending in the long side direction for improving electrical connection of solar cells. When the collecting electrode includes bus bar, it is preferable that only one bus bar electrode that extends in the long side direction is provided in the vicinity of the long side so that the shading area can be reduced in the stacked solar cell.

In the present invention, the electroconductive member can also function as a wiring member and a bus bar electrode as described above. Accordingly, the electrode for collecting currents gathered by the finger electrodes is not required to have a continuous shape like that of the bus bar electrode, and may be an electrode having a discontinuous shape.

The distance between finger electrodes, the width of the finger electrode, the width of the bus bar electrode, and so on can be set appropriately, according to the resistance of the transparent electrode layer formed on the light-receiving side of the photoelectric conversion section.

As a material for forming the collecting electrode 7, a paste containing a binder resin etc. can be used. For sufficiently improving the electroconductivity of a collecting electrode formed by a screen printing method, it is desirable to cure the collecting electrode by a heat treatment. Accordingly, it is preferable that a material capable of being cured at a drying temperature is used as a binder resin contained in the paste, and an epoxy-based resin, a phenol-based resin, an acryl-based resin or the like is applicable.

The collecting electrode 7 can be formed by a known method such as an inkjet method, a screen printing method, a conducting wire bonding method, a spraying method, a vacuum vapor deposition method, a sputtering method or a plating method. For example, the collecting electrode can be formed by a vacuum vapor deposition method or a sputtering method using a mask conforming to a pattern shape. Particularly, it is preferable to form the collecting electrode by a plating method because the collecting electrode can be thinned.

(Back Electrode)

The back electrode 8 is formed on the transparent electrode layer 6b on the back side. As with the collecting electrode on the light-receiving side, current extraction efficiency can be improved by providing a back electrode (metal electrode as an auxiliary electrode) on a surface of the transparent electrode layer on the back side.

A material having a reflectivity in a near-infrared to infrared range and having high electroconductivity and chemical stability is preferably used as the back electrode 8. Examples of the material having the above-mentioned characteristic include silver and aluminum. The method for forming the back electrode 8 is not particularly limited, and a physical vapor deposition method such as a sputtering method or a vacuum vapor deposition method, a printing method such as screen printing, a plating method, or the like is applicable.

The back electrode 8 is provided as an electrode on a side opposite to the light-receiving surface, and therefore may be formed so as to cover the whole surface of the photoelectric conversion section. As with the collecting electrode on the light-receiving side, the back electrode may be formed in a pattern shape.

The present invention has been described with a heterojunction solar cell as an example, but the solar cell that forms the solar cell module according to the present invention is not particularly limited as long as it includes a crystalline silicon substrate, and crystalline silicon-based solar cells other than heterojunction solar cells can be used. In one form of the crystalline silicon-based solar cell, conductive impurities such as phosphorus atoms are diffused to form a silicon layer of opposite conductivity-type (n-type) on the light-receiving side of a crystalline silicon substrate of first conductivity-type (p-type), so that a photoelectric conversion section composed of a semiconductor junction is formed. In a diffusion type crystalline silicon solar cell described above, a transparent electrode layer is not formed, and therefore a collecting electrode may be formed directly on a photoelectric conversion section composed of a semiconductor junction.

Figure 5:
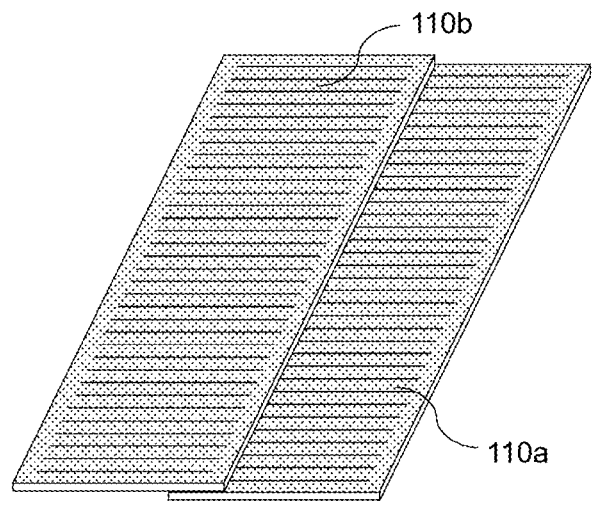
FIG. 5 is a perspective view schematically showing a first solar cell and a second solar cell that forms the solar cell module shown in FIG. 1.

FIG. 5 is a perspective view schematically showing a first solar cell and a second solar cell that forms the solar cell module shown in FIG. 1. As shown in FIG. 5, the first solar cell 110a and the second solar cell 110b are stacked in such a manner that the peripheries thereof overlap each other.

Figure 6:
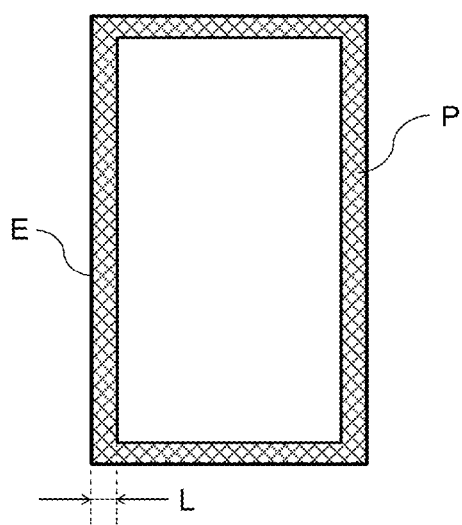
FIG. 6 is a schematic view for explaining the periphery of a solar cell.

FIG. 6 is a schematic view for explaining the periphery of a solar cell. The periphery of a solar cell means a region including an end E of a principal surface and extending over a distance L from the end E (region represented by P in FIG. 6). The distance L is preferably 0 mm<L≤1.5 mm, more preferably 0 mm<L≤0.50 mm, especially preferably 0.02 mm<L≤0.15 mm.

When the plane shape of the solar cell is a substantially oblong shape as shown in FIG. 3 and FIG. 4, it is preferable that the first solar cell 110a and the second solar cell 110b are stacked in such a manner that the long sides thereof overlap each other. When the solar cell has a bus bar electrode as shown in FIG. 4, it is preferable that the bus bar electrode is covered with an upper solar cell. Specifically, it is preferable that the bus bar electrode of the first solar cell 110a is covered with the second solar cell 110b.

Hereinafter, preferred embodiments of the solar cell module according to the present invention will be described with attention given to the first solar cell and the second solar cell that form the solar cell module according to the present invention. The present invention is not limited to the following embodiments.

Embodiment 1

First, one example of a method for manufacturing a solar cell module according to embodiment 1 will be described with reference to FIGS. 7A and 7B and FIGS. 8A and 8B.

Figure 7A:
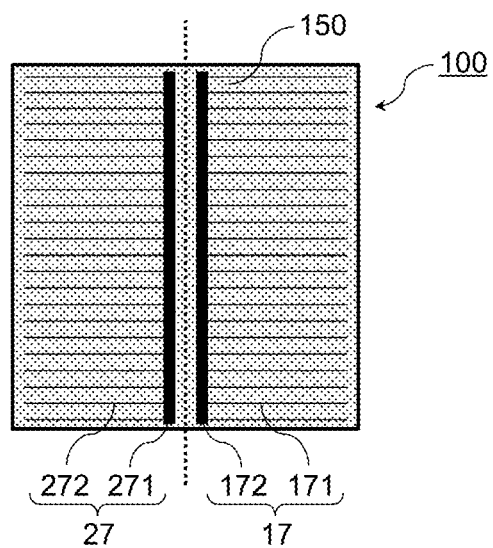
FIGS. 7A and 7B are schematic views showing one example of a method for manufacturing a solar cell module according to embodiment 1.

As shown in FIG. 7A, a solar cell 100 is provided and the solar cell 100 is cleaved into two parts. The solar cell 100 has a photoelectric conversion section 150 that includes a single-crystalline silicon substrate of first conductivity-type, collecting electrodes 17 and 27 provided on a light-receiving surface of the photoelectric conversion section 150, and a back electrode (not illustrated) provided on a back surface of the photoelectric conversion section 150. The collecting electrode 17 includes a finger electrode 171 and a bus bar electrode 172, and the collecting electrode 27 includes a finger electrode 271 and a bus bar electrode 272.

The single-crystalline silicon substrate is prepared by slicing a silicon ingot to a predetermined thickness using a wire saw etc., the silicon ingot being prepared by, for example, a Czochralski method. The substrate usually has a size of 5-inch square or 6-inch square. The shape of the substrate is a shape called a semi-square-type in which the four corners are rounded, a substantially square shape called a full-square, or the like.

In FIG. 7A, the collecting electrode and the back electrode are formed in each of two regions on the photoelectric conversion section 150 so that the solar cell can be separated into two solar cells by cleavage.

Figure 7B:
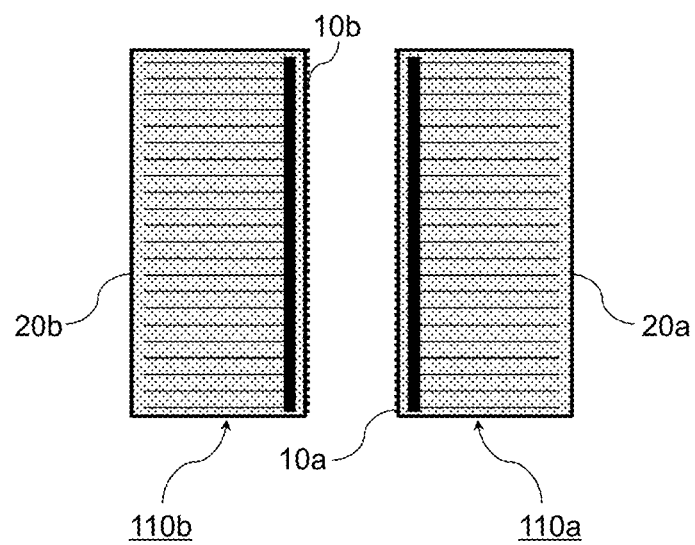

FIG. 7B shows a state after the solar cell 100 is cleaved. The solar cell 100 is cleaved to prepare a first solar cell 110a and a second solar cell 110b each having an oblong shape in terms of a plane shape.

Examples of the method for cleaving the solar cell include a method in which a groove extending to the substrate is formed by laser irradiation, and the solar cell is bent and broken by hands, a machine or the like; a method in which the solar cell having the substrate is completely divided by laser irradiation; a method in which a groove extending to the substrate is formed by a mechanical dicing method using a diamond blade, and the solar cell is bent and broken by hands, a machine or the like; and a method in which the solar cell is completely divided by a mechanical dicing method.

By cleavage, a cleaved surface 10a is formed on a lateral of the single-crystalline silicon substrate of first conductivity-type of the first solar cell 110a, and a cleaved surface 10b is formed on a lateral of the single-crystalline silicon substrate of first conductivity-type of the second solar cell 110b as shown in FIG. 7B. For example, a laser trace is formed on the cleaved surface in cleavage by laser irradiation, and a dicing trace is formed on the cleaved surface in cleavage by a mechanical dicing method.

On the other hand, a lateral on a side opposite to the cleaved surface 10a is a non-cleaved surface 20a, and a lateral on a side opposite to the cleaved surface 10b is a non-cleaved surface 20b.

Of the laterals of the substrate (or solar cell), the cut section formed in cleavage of the solar cell is referred to as a "cleaved surface", and the lateral which is not related to cleavage is referred to as a "non-cleaved surface" in this specification. The purpose of forming the cleaved surface is not particularly limited. The cleaved surface may be formed to divide the solar cell to any size, or may be formed for insulation so that a short-circuit between the electrode on the light-receiving side and the electrode on the back side is eliminated.

Figure 8A:
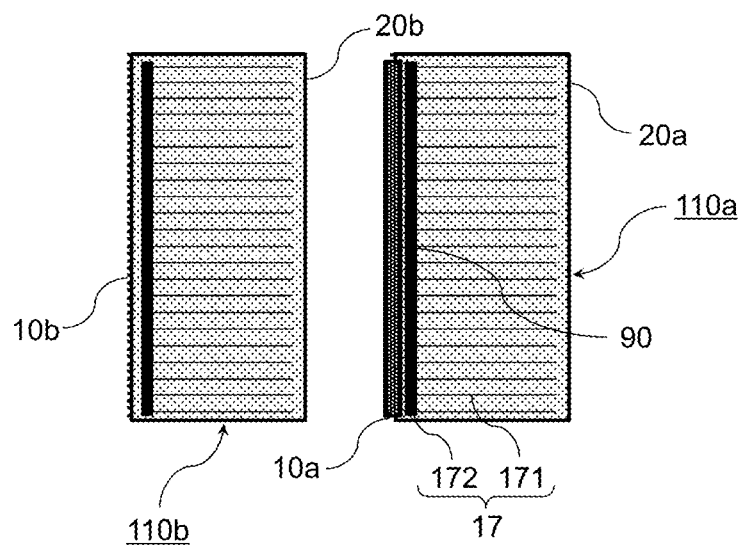
FIGS. 8A and 8B are schematic views showing one example of a method for manufacturing a solar cell module according to embodiment 1.

After cleavage, an insulating member 90 is formed on the light-receiving surface of the photoelectric conversion section 150a of the first solar cell 110a as shown in FIG. 8A. FIG. 8A shows an example in which the collecting electrode 17 is not provided on the cleaved surface 10a-side periphery, where the insulating member 90 is formed on the cleaved surface 10a-side periphery. Accordingly, the insulating member 90 is disposed on the cleaved surface 10a-side from the collecting electrode 17 of the first solar cell 110a.

Figure 8B:
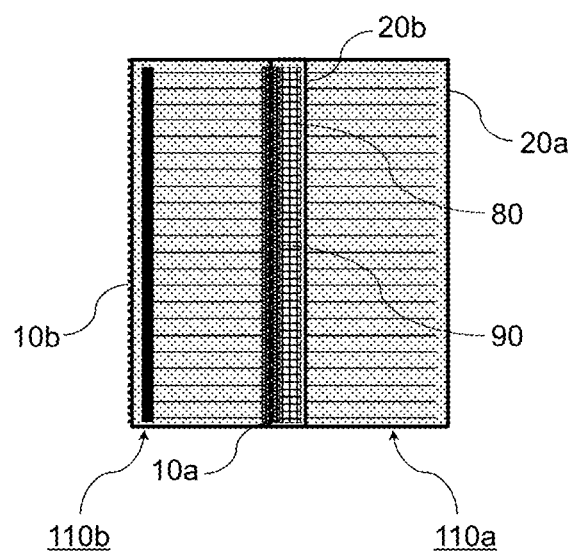

After the insulating member 90 is formed, the first solar cell 110a and the second solar cell 110b are stacked together with an electroconductive member 80 interposed therebetween as shown in FIG. 8B. In this embodiment, the first solar cell 110a and the second solar cell 110b are stacked in such a manner that the cleaved surface 10a-side periphery on the light-receiving surface of the first solar cell 110a overlaps the non-cleaved surface 20b-side periphery on the back surface of the second solar cell 110b.

Thereafter, the first solar cell 110a and the second solar cell 110b are compression-bonded to each other. Conditions in compression-bonding the solar cells are not particularly limited. It is preferable that the temperature is 130° C. to 160° C., the time is 3 minutes to 5 minutes, and the pressure is 70 kPa to 100 kPa. Accordingly, at a stacked section of the first solar cell 110a and the second solar cell 110b, the collecting electrode 17 of the first solar cell 110a and the back electrode 28 of the second solar cell 110b are electrically connected to each other by coming into contact with the electroconductive member 80.

In this way, a stacked body of the first solar cell 110a and the second solar cell 110b can be prepared. Thereafter, a solar cell module can be prepared by sealing the stacked body using a sealing material as shown in FIG. 1.

The method for preparing the stacked body of the first solar cell 110a and the second solar cell 110b is not limited to the above-mentioned method. For example, the photoelectric conversion section and the collecting electrode may be formed after the substrate is cleaved, or the collecting electrode may be formed after the substrate provided with the photoelectric conversion section is cleaved. The back electrode may be formed before cleavage, or may be formed after cleavage. For reducing the manufacturing process, it is preferable that a solar cell having a photoelectric conversion section and provided with a collecting electrode and a back electrode is prepared, and then cleaved to a predetermined size.

FIGS. 9(a) to 9(c) are schematic views of a stacked body of a first solar cell and a second solar cell which is prepared by the above-mentioned method, where embodiment 1 is schematically shown. FIG. 9(a) is a plan view of the first solar cell provided with an electroconductive member and an insulating member (corresponding to FIG. 8A). FIG. 9(b) is a plan view of the stacked body of the first solar cell and the second solar cell (corresponding to FIG. 8B). FIG. 9(c) is a sectional view of the stacked body of the first solar cell and the second solar cell (corresponding to FIG. 8B). In FIG. 9(b), the electroconductive member and the insulating member are omitted for the sake of convenience.

As described above, the first solar cell 110a and the second solar cell 110b are stacked in such a manner that the peripheries thereof overlap each other. Specifically, the first solar cell 110a and the second solar cell 110b each have an oblong shape in terms of a plane shape, and are stacked in such a manner that the long sides thereof overlap each other.

In the first solar cell 110a shown in FIG. 9(c), a photoelectric conversion section 150a includes a single-crystalline silicon substrate of first conductivity-type, the collecting electrode 17 is formed on the light-receiving surface of the photoelectric conversion section 150a, and the back electrode 18 is formed on the back surface of the photoelectric conversion section 150a. The first solar cell 110a is prepared by, for example, cleaving a solar cell. Accordingly, the single-crystalline silicon substrate of first conductivity-type of the first solar cell 110a has a cleaved surface 10a and a non-cleaved surface 20a each extending from the first principal surface on the light-receiving side to the second principal surface on the back side.

Similarly, in the second solar cell 110b, a photoelectric conversion section 150b includes a single-crystalline silicon substrate of first conductivity-type, a collecting electrode 27 is formed on the light-receiving surface of the photoelectric conversion section 150b, and the back electrode 28 is formed on the back surface of the photoelectric conversion section 150b. The single-crystalline silicon substrate of first conductivity-type of the second solar cell 110b has a cleaved surface 10b and a non-cleaved surface 20b each extending from the first principal surface on the light-receiving side to the second principal surface on the back side.

In embodiment 1, a transparent electrode layer 16a is formed on the whole of the light-receiving surface of the photoelectric conversion section 150a of the first solar cell 110a, and the insulating member 90 is provided on the transparent electrode layer 16a.

Preferably, the collecting electrode 17 of the first solar cell 110a includes the finger electrode 171 and the bus bar electrode 172 as shown in FIGS. 9(a) to 9(c). Preferably, the bus bar electrode 172 is formed so as to be substantially orthogonal to the finger electrode 171. Particularly, when the plane shape of the first solar cell 110a is a substantially oblong shape with a short side and a long side, it is preferable that the finger electrode 171 is formed so as to extend in the short side direction, and the bus bar electrode 172 is formed so as to extend in the long side direction. Particularly, it is preferable that one bus bar electrode 172 extending in the long side direction is formed in the vicinity of the cleaved surface 10a-side long side of the photoelectric conversion section 150a. For suppressing a shading loss, it is preferable that the first solar cell 110a and the second solar cell 110b are stacked in such a manner that the bus bar electrode 172 is covered with the second solar cell 110b as shown in FIGS. 9(b) and 9(c). It is preferable that the whole surface of the bus bar electrode 172 is covered with the second solar cell 110b, and further, the finger electrode 171 may be partially covered with the second solar cell 110b. On the other hand, the bus bar electrode 172 may be partially covered with the second solar cell 110b.

Although the structure of the collecting electrode 27 of the second solar cell 110b is not particularly limited, it is preferably the structure of the collecting electrode 27 is same as the structure of the collecting electrode 17 of the first solar cell 110a.

The width (length represented by $W_0$ in FIG. 9(b)) of the stacked section of the first solar cell 110a and the second solar cell 110*b* (hereinafter, referred to simply as a stacked section) is preferably 0.5 mm to 4 mm, more preferably 0.5 mm to 2 mm for suppressing a shading loss.

Figure 9:
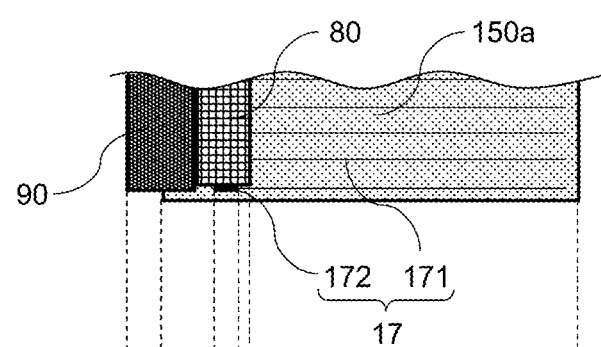
FIG. 9 is a schematic view of embodiment 1.
Figure 9:
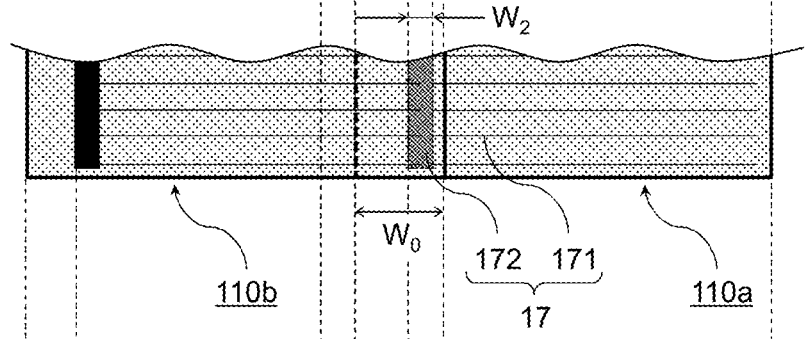
Figure 9:
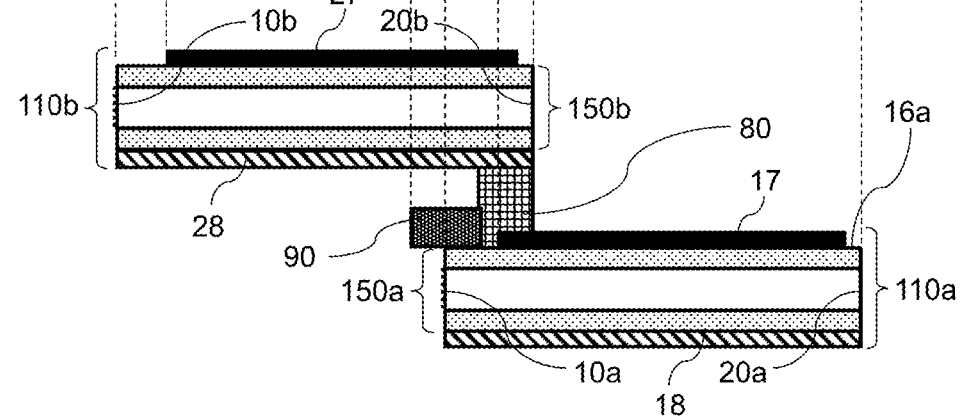

The width (length represented by $W_1$ in FIG. 9(*b*)) of the collecting electrode 17 at the stacked section is preferably 0.35 mm to 2.5 mm. As shown in FIG. 9(*b*), the width of the collecting electrode 17 at the stacked section means the total of the width of the finger electrode 171 and the bus bar electrode 172 when the collecting electrode 17 includes the finger electrode 171 and the bus bar electrode 172. The width (length represented by $W_2$ in FIG. 9(*b*)) of the bus bar electrode 172 is preferably 0.35 mm to 4 mm, more preferably 0.35 mm to 2 mm.

As a material for forming the electroconductive member 80, for example, an electroconductive paste obtained by adding electroconductive fine particles to a resin paste can be used. As the resin paste, for example, an epoxy resin, an imide resin, a phenol resin or the like is used. As the electroconductive particles, for example, electroconductive powder such as metal powder of Ni, Au, Ag, Cu, Zn, In or the like, carbon powder, or the like is used. Further, as the electroconductive particles, metal powder whose surface is coated with a metal film, or particles which are composed of an epoxy resin, an acrylic resin, a polyimide resin, a phenol resin or the like and whose surfaces are coated with a metal film can be used. Particularly, Cu particles coated with a Ni or Ag film are preferable from the viewpoint of costs and reliability. The average particle size of the electroconductive particles is 1 µm to 30 µm, preferably 5 µm to 15 µm, more preferably 8 µm to 12 µm from the viewpoint of costs and ease of processing. Among electroconductive pastes, Ag-containing electroconductive pastes are preferable.

As a material for forming the electroconductive member 80, a conductive film may also be used.

As a material for the insulating member 90, polycarbonate, polyimide, polyester, polyethylene, Teflon (registered trademark), cellophane, an epoxy resin, an acrylic resin, a phenol resin, a silicone resin or the like is used.

The insulating member 90 is preferably in a tacky form, for example in the form of a pressure sensitive adhesive tape including the above-mentioned material. Particularly, it is preferable to use a tape made of polyimide. In this case, it is preferable that the insulating member 90 has tackiness on a surface on the first solar cell 110*a*-side for easily attaching the insulating member 90 onto the first solar cell 110*a*.

The thickness of the insulating member 90 is preferably equal to or greater than the thickness of the collecting electrode 17. Specifically, the thickness of the insulating member 90 is preferably 1 µm or more and 500 µm or less, more preferably 30 µm or more and 100 µm or less. When the thickness of the insulating member 90 is in a range as described above, protection of the laterals of the cell and a buffer effect during stacking can be expected.

The insulating member 90 may also be provided outside the cleaved surface 10*a*-side end of the photoelectric conversion section 150*a* of the first solar cell 110*a* as shown in FIG. 9(*a*) and FIG. 9(*c*).

Preferably, the insulating member 90 is provided in such a manner that the electroconductive member 80 does not stick to a lateral of the first solar cell 110*a*. For example, when the insulating member 90 is provided outside the cleaved surface 10*a*-side end of the first solar cell 110*a* as shown in FIG. 9(*a*) and FIG. 9(*c*), the insulating member 90 can serve as a barrier for preventing the electroconductive member 80 from sticking to a lateral of the first solar cell 110*a*, even if the electroconductive member 80 protrudes to the cleaved surface 10*a*-side during compression-bonding.

As a result, a short-circuit can be prevented, so that deterioration of module reliability can be suppressed.

In the solar cell module of this embodiment, solar cells are stacked to reduce the shading area of the bus bar electrode etc., thereby improving module conversion efficiency.

Solar cells having a stacking configuration as described above can be easily prepared by, for example, cleaving a solar cell prepared beforehand to a predetermined size. On the other hand, a cleaved surface formed on a lateral of the solar cell by cleavage deteriorates characteristics such as module conversion efficiency and reliability. Deterioration of module characteristics, which is caused from the cleaved surface, can be suppressed by stacking solar cells in such a manner that the cleaved surface of a lower solar cell provides a shading section.

A cleaved surface having a laser trace etc. is inferior in mechanical strength to a non-cleaved surface, and therefore when a cleaved surface of a lower solar cell is covered with an upper solar cell, damage easily occurs at the cleaved surface of the lower solar cell during stacking the solar cells or sealing the solar cells using a sealing material. In this embodiment, solar cells are stacked together with an insulating member provided on the cleaved surface-side periphery of the solar cell, so that the insulating member functions as a buffer material. Accordingly, damage to the solar cell, which is caused from the cleaved surface, can be prevented. Further, by providing the insulating member, stress applied during compression-bonding can be distributed to the electroconductive member and the insulating member, and therefore damage to the bonded section can be suppressed. As a result, deterioration of module conversion efficiency and reliability can be suppressed.

Further, by providing the insulating member, the electroconductive member can be prevented from wrapping around to a lateral of the first solar cell, and therefore diffusion of metal components in the electroconductive member to the silicon layer can be prevented.

The solar cell module of this embodiment can be bent to a curved shape. A crystalline silicon substrate that is generally used has a size of 5-inch square or 6-inch square, and a thickness of about 100 to 150 µm, and when a module prepared using such a substrate is bent, the solar cell is soon damaged. On the other hand, in this embodiment, a substrate is cleaved to a small size, the peripheries (e.g., long sides) are superimposed on one another to prepare a solar cell module, and therefore damage to the solar cell can be prevented even when the module is bent.

Embodiment 2

Figure 10:
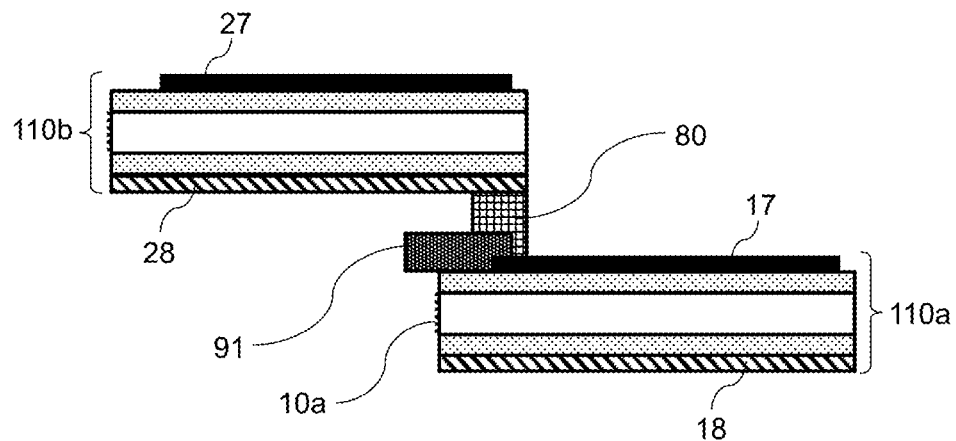
FIG. 10 is a schematic view of embodiment 2.

FIG. 10 schematically shows embodiment 2. In FIG. 10, an insulating member 91 is also provided on a collecting electrode 17 of a first solar cell 110*a*.

In embodiment 2, the area of the insulating member at the stacked section can be increased, and therefore a higher buffer effect can be expected.

Embodiment 3

Figure 11:
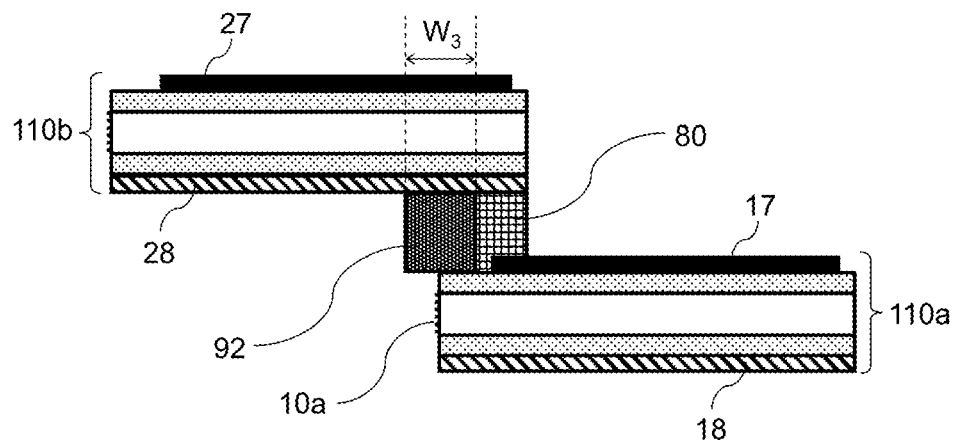
FIG. 11 is a schematic view of embodiment 3.

FIG. 11 schematically shows embodiment 3. In FIG. 11, an insulating member 92 is in contact with a back electrode 28 of a second solar cell 110*b*. Preferably, a double-side tape made of polyimide etc. is used as the insulating member 92.

In embodiment 3, not only the effect described in embodiment 1 can be obtained, but also misregistration at the time of superimposing solar cells on each other can be suppressed. As a result, a poor external appearance that may be caused by misregistration of solar cells, and associated deterioration of module performance can be suppressed.

The width (length represented by $W_3$ in FIG. 11) of the insulating member 92 that is in contact with the back electrode 28 of the second solar cell 110b is not particularly limited. When the insulating member 92 is a double-sided tape, the width of the insulating member 92 is preferably 0.5 mm or more from the viewpoint of adhesion. The width of the insulating member 92 is preferably 5 mm or less from the viewpoint of material costs.

Embodiment 4

Figure 12:
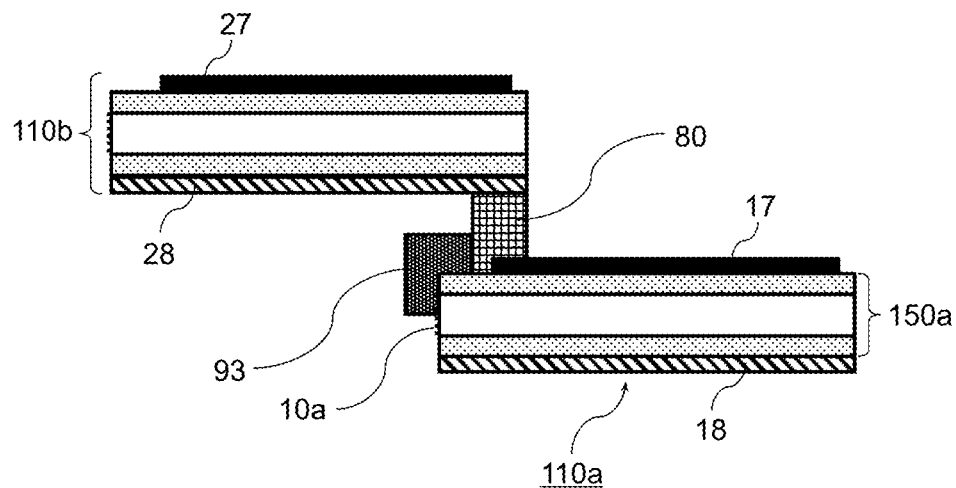
FIG. 12 is a schematic view of embodiment 4.

FIG. 12 schematically shows embodiment 4. In FIG. 12, an insulating member 93 is also provided on the cleaved surface 10a-side lateral of a photoelectric conversion section 150a of a first solar cell 110a.

In embodiment 4, not only the effect described in embodiment 1 can be obtained, but also damage at a lateral of the first solar cell can be more reliably suppressed. Metal diffusion from a lateral of the first solar cell can also be suppressed. Further, ingress of moisture from the end of the solar cell during modularization can also be prevented.

Embodiment 5

Figure 13:
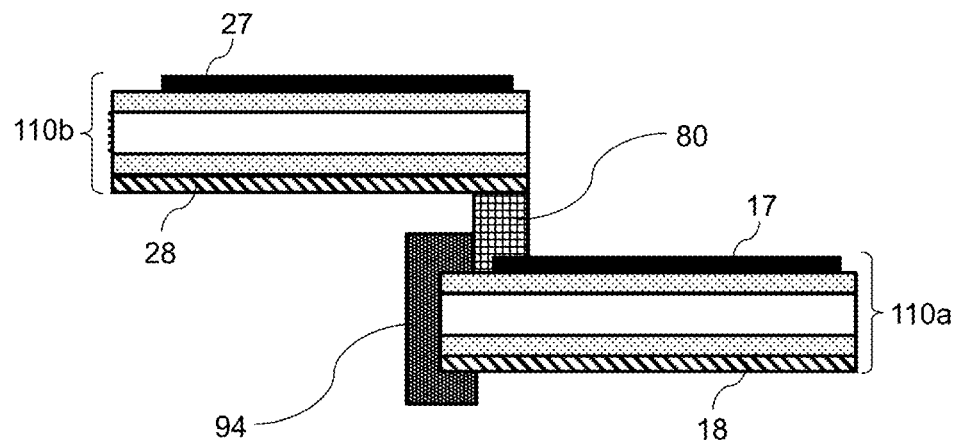
FIG. 13 is a schematic view of embodiment 5.

FIG. 13 schematically shows embodiment 5. In FIG. 13, an insulating member 94 is provided on a back surface of a first solar cell 110a as well as on the cleaved surface 10a-side lateral of a photoelectric conversion section 150a of the first solar cell 110a.

In embodiment 5, a region where the insulating member is provided is wide, so that an electroconductive member 80 can be prevented from wrapping around to a back electrode 18 of the first solar cell 110a during compression-bonding. As a result, a short-circuit between the back electrode 18 of the first solar cell 110a and a back electrode 28 of a second solar cell 110b can be prevented.

Embodiment 6

Figure 14:
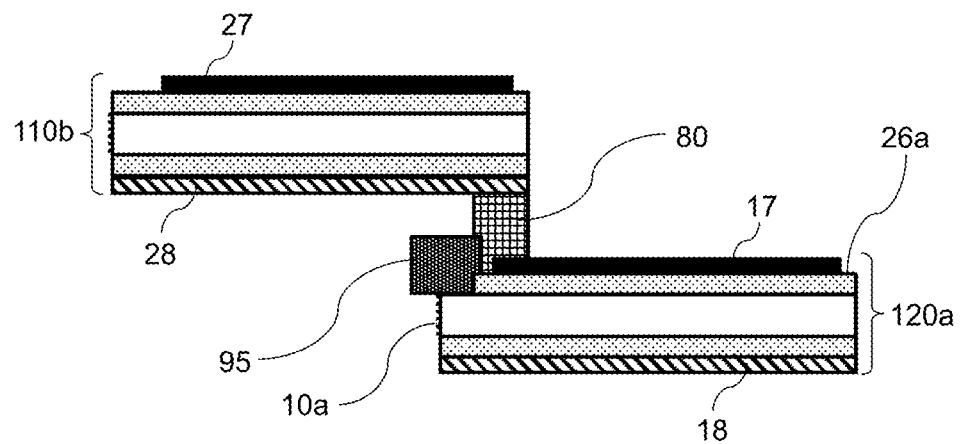
FIG. 14 is a schematic view of embodiment 6.

FIG. 14 schematically shows embodiment 6. In embodiment 1 shown in FIG. 9(a), etc., a transparent electrode layer 16a is formed on the whole of the light-receiving surface of a photoelectric conversion section 150a of a first solar cell 110a. On the other hand, in embodiment 6 shown in FIG. 14, a photoelectric conversion section 150a of a first solar cell 110a includes a transparent electrode layer-non-formed region where a transparent electrode layer 26a is not formed on the cleaved surface 10a-side periphery. An insulating member 95 is provided on the transparent electrode layer-non-formed region.

The transparent electrode layer-non-formed region can be formed by an insulation process. The transparent electrode layer-non-formed region can be formed by, for example, a method in which a transparent electrode layer is removed by etching.

In embodiment 6, a silicon layer on a region where the transparent electrode layer is not provided can be protected with an insulating member, and therefore diffusion of metal components in an electroconductive member etc. to a substrate can be prevented.

Other Embodiments

Figure 15:
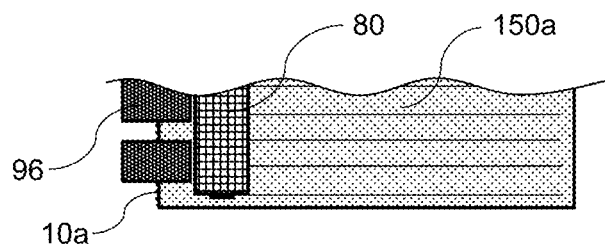
FIG. 15 is a schematic view of an insulating member in another embodiment.

For suppressing damage to solar cells, it is preferable that insulating members 90 to 95 are provided on almost the whole of the cleaved surface 10a-side periphery of the photoelectric conversion section 150a as shown in embodiments 1 to 6. An insulating member may be provided on a part of the cleaved surface 10a-side periphery of the photoelectric conversion section 150a as is shown with an insulating member 96 in FIG. 15.

The insulating member may be provided discontinuously, although the insulating members 90 to 95 are provided continuously in embodiments 1 to 6.

Figure 16:
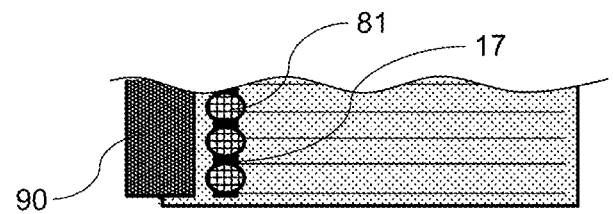
FIG. 16 is a schematic view of an electroconductive member in another embodiment.

For suppressing the loss by resistance, it is preferable that the electroconductive member 80 is provided on almost the whole surface of the collecting electrode 17 of the first solar cell 110a at the stacked section as shown in embodiments 1 to 6. An electroconductive member may be provided on a part of the collecting electrode 17 of the first solar cell 110a as is shown with an electroconductive member 81 shown in FIG. 16.

When the first solar cell is seen in plan view, the region where the electroconductive member is provided over the area of the collecting electrode at the stacked section is preferably 30% or more, more preferably 50% or more.

Figure 17:
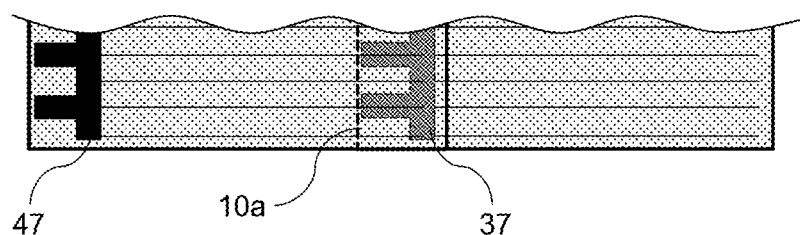
FIG. 17 is a schematic view of a collecting electrode in another embodiment.
Figure 18:
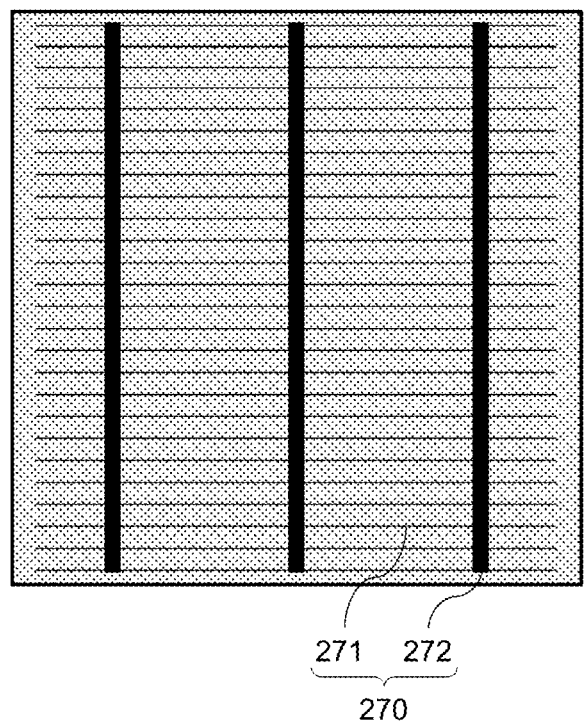
FIG. 18 is a plan view schematically showing one example of a collecting electrode to be used in a conventional crystalline silicon-based solar cell.

For preventing a short-circuit, it is preferable that the collecting electrode 17 of the first solar cell 110a is not provided on the whole region of the cleaved surface 10a-side periphery as shown in embodiments 1 to 6. A collecting electrode may be provided on a part of the cleaved surface 10a-side periphery as is shown with a collecting electrode 37 in FIG. 17. The shape of a collecting electrode 47 of the second solar cell 110b may be the same as or different from the shape of the collecting electrode 37 of the first solar cell 110a.

On the periphery except for the cleaved surface 10a-side periphery, the collecting electrode 17 may be formed, but for suppressing diffusion of metal components in the collecting electrode and preventing a short-circuit, it is preferable that the collecting electrode 17 is not formed on the whole region of the periphery on the light-receiving surface. The distance between the periphery of the photoelectric conversion section and the collecting electrode on the cleaved surface-side periphery may be the same as or different from that on the other periphery.

As long as the solar cell module according to the present invention includes a first solar cell and a second solar cell having the above-mentioned stacking configuration, the method for manufacturing the solar cell module is not limited to the method shown in FIGS. 7A and 7B and FIGS. 8A and 8B. For suppressing deterioration of module conversion efficiency and reliability, a lateral of the second solar cell, which is stacked to the first solar cell, is preferably a non-cleaved surface as shown in the foregoing embodiments, but it may be a cleaved surface. A lateral of the first solar cell, which is not stacked to the second solar cell, may be a cleaved surface or a non-cleaved surface, and similarly, a lateral of the second solar cell, which is not laminated to the first solar cell, may be a cleaved surface or a non-cleaved surface.

The solar cell module according to the present invention may include other solar cells as long as it includes a first solar cell and a second solar cell having the above-mentioned stacking configuration. For example, a solar cell module may be prepared by cleaving each of two solar cells into two parts to provide two stacked bodies, and then these stacked bodies are stacked, wherein the cleaved surface-side periphery of a first solar cell and the non-cleaved surface-side periphery of a second solar cell are stacked to each other in one stacked body, and the cleaved surface-side periphery of a third solar cell and the non-cleaved surface-side periphery of a fourth solar cell are stacked to each other in the other stacked body. In this embodiment, it is preferable that the stacked bodies are stacked in such a manner that the cleaved surface-side periphery of the fourth solar cell overlaps the non-cleaved surface-side periphery of the first solar cell, or the stacked bodies are stacked in such a manner that the cleaved surface-side periphery of the second solar cell overlaps the non-cleaved surface-side periphery of the third solar cell. When the solar cell module includes solar cells other than the first solar cell and the second solar cell, it is preferable that an insulating member as described above is provided on a section where the solar cells are stacked (e.g., a stacked section of the third solar cell and the fourth solar cell).

DESCRIPTION OF REFERENCE CHARACTERS 1 single-crystalline silicon substrate of first conductivity-type
2a, 2b intrinsic silicon-based thin-film
3a, 3b conductive silicon-based thin-film
6a, 6b, 16a, 26a transparent electrode layer
7, 17, 27, 37, 47 collecting electrode
8, 18, 28 back electrode
10a, 10b cleaved surface
20a, 20b non-cleaved surface
50, 150, 150a, 150b photoelectric conversion section
71, 171, 271 finger electrode
72, 172, 272 bus bar electrode
80, 81, 180 electroconductive member
90, 91, 92, 93, 94, 95, 96, 190 insulating member
100, 110a, 110b, 110c solar cell
111 heterojunction solar cell
200 solar cell module
201 light-receiving side protective material
202 back side protective material
203 sealing material

The invention claimed is:
1. A solar cell module comprising:
a first solar cell; a second solar cell; an electroconductive member; and an insulating member, wherein
the first solar cell and the second solar cell each have:
a photoelectric conversion section that includes a crystalline silicon substrate of first conductivity-type; a collecting electrode provided on a light-receiving surface of the photoelectric conversion section; and a back electrode provided on a back surface of the photoelectric conversion section,
in the first solar cell, the crystalline silicon substrate of first conductivity-type has a first principal surface on a light-receiving side, a second principal surface on a back side, and a cleaved surface extending from the first principal surface to the second principal surface,
the first solar cell and the second solar cell are stacked together with the electroconductive member interposed therebetween in such a manner that a cleaved surface-side periphery on the light-receiving surface of the first solar cell overlaps a periphery on the back surface of the second solar cell,
at least a part of the electroconductive member directly interfaces with the light-receiving surface of the first solar cell,
at a stacked section where the first solar cell and the second solar cell are stacked,
the collecting electrode of the first solar cell and the back electrode of the second solar cell are electrically connected to each other by coming into contact with the electroconductive member,
the insulating member is arranged side-by-side with the electroconductive member on a part of the cleaved surface-side periphery on the light-receiving surface of the first solar cell, where the collecting electrode is not provided.

2. The solar cell module according to claim 1, wherein
in the second solar cell, the crystalline silicon substrate of first conductivity-type has a first principal surface on the light-receiving side, a second principal surface on the back side, and a non-cleaved surface extending from the first principal surface to the second principal surface,
the first solar cell and the second solar cell are stacked together with the electroconductive member interposed therebetween in such a manner that the cleaved surface-side periphery on the light-receiving surface of the first solar cell overlaps a non-cleaved surface-side periphery on the back surface of the second solar cell.

3. The solar cell module according to claim 1, wherein each of the first solar cell and the second solar cell has a substantially oblong plane shape with a short side and a long side,
the first solar cell and the second solar cell are stacked together in such a manner that the long side of the first solar cell overlaps the long side of the second solar cell,
the collecting electrode of the first solar cell includes a plurality of finger electrodes extending in a short side direction.

4. The solar cell module according to claim 3, wherein the collecting electrode of the first solar cell further includes one bus bar electrode extending in a long side direction.

5. The solar cell module according to claim 4, wherein the bus bar electrode of the first solar cell is provided on a stacked section of the first solar cell and the second solar cell.

6. The solar cell module according to claim 1, wherein the insulating member is also provided outside the cleaved surface-side end of the photoelectric conversion section of the first solar cell.

7. The solar cell module according to claim 1, wherein the insulating member is also provided on the collecting electrode of the first solar cell.

8. The solar cell module according to claim 1, wherein the insulating member is in contact with the back electrode of the second solar cell.

9. The solar cell module according to claim 1, wherein the insulating member is also provided on a cleaved surface-side lateral of the photoelectric conversion section of the first solar cell.

10. The solar cell module according to claim 9, wherein the insulating member is also provided on the back surface of the first solar cell.

11. The solar cell module according to claim 1, wherein the photoelectric conversion section of the first solar cell and the photoelectric conversion section of the second solar cell each include a silicon-based thin-film of opposite conductivity-type on one principal surface of the crystalline silicon substrate of first conductivity-type and further include a transparent electrode layer on the silicon-based thin-film of opposite conductivity-type.

12. The solar cell module according to claim 11, wherein
in the first solar cell, the photoelectric conversion section has a transparent electrode layer-formed region where the transparent electrode layer is formed on the silicon-based thin-film of opposite conductivity-type, and a transparent electrode layer-non-formed region where the transparent electrode layer is not formed on the silicon-based thin-film of opposite conductivity-type, and the insulating member is provided on the transparent electrode layer-non-formed region.

13. The solar cell module according to claim 1, wherein a thickness of the insulating member is 1 µm or more and 500 µm or less.

14. A method for manufacturing a solar cell module according to claim 1, comprising steps of:

providing a first solar cell and a second solar cell;

forming an insulating member on a light-receiving surface of the first solar cell; and stacking the first solar cell and the second solar cell with an electroconductive member interposed therebetween such that at least a part of the electroconductive member directly interfaces with the light-receiving surface of the first solar cell, wherein the first solar cell and the second solar cell each have:
a photoelectric conversion section that includes a crystalline silicon substrate of first conductivity-type; a collecting electrode provided on the light-receiving surface of the photoelectric conversion section; and a back electrode provided on a back surface of the photoelectric conversion section, in the first solar cell, the crystalline silicon substrate of first conductivity-type has a first principal surface on a light-receiving side, a second principal surface on a back side, and a cleaved surface extending from the first principal surface to the second principal surface, the insulating member is arranged side-by-side with the electroconductive member on a part of the cleaved surface-side periphery on the light-receiving surface of the first solar cell, where the collecting electrode is not provided, the first solar cell and the second solar cell are stacked in such a manner that the cleaved surface-side periphery on the light-receiving surface of the first solar cell overlaps the periphery on the back surface of the second solar cell, at a stacked section where the first solar cell and the second solar cell are stacked, the collecting electrode of the first solar cell and the back electrode of the second solar cell are electrically connected to each other by coming into contact with the electroconductive member.

15. The method for manufacturing a solar cell module according to claim 14, wherein in the step of providing the first solar cell and the second solar cell, the first solar cell and the second solar cell are prepared by cleaving a solar cell which has a photoelectric conversion section that includes a crystalline silicon substrate of first conductivity-type, a collecting electrode provided on the light-receiving surface of the photoelectric conversion section, and a back electrode provided on a back surface of the photoelectric conversion section.

* * * * *